United States Patent
Hiroi et al.

(10) Patent No.: US 12,176,131 B2
(45) Date of Patent: Dec. 24, 2024

(54) ELECTROMAGNETIC WAVE ABSORBER

(71) Applicant: Maxell, Ltd., Kyoto (JP)

(72) Inventors: Toshio Hiroi, Kyoto (JP); Masao Fujita, Kyoto (JP)

(73) Assignee: Maxell, Ltd., Kyoto (JP)

(*) Notice: Subject to any disclaimer, the term of this patent is extended or adjusted under 35 U.S.C. 154(b) by 772 days.

(21) Appl. No.: 15/734,714

(22) PCT Filed: May 31, 2019

(86) PCT No.: PCT/JP2019/021837
§ 371 (c)(1),
(2) Date: Dec. 3, 2020

(87) PCT Pub. No.: WO2019/235393
PCT Pub. Date: Dec. 12, 2019

(65) Prior Publication Data
US 2021/0225567 A1   Jul. 22, 2021

(30) Foreign Application Priority Data
Jun. 4, 2018 (JP) .............................. 2018-107184

(51) Int. Cl.
*H01F 1/34* (2006.01)
*H01Q 17/00* (2006.01)
*H05K 9/00* (2006.01)

(52) U.S. Cl.
CPC ........... *H01F 1/348* (2013.01); *H01Q 17/002* (2013.01); *H05K 9/0081* (2013.01)

(58) Field of Classification Search
CPC ..... H01F 1/348; H01Q 17/002; H05K 9/0081
(Continued)

(56) References Cited

U.S. PATENT DOCUMENTS

| | | | | | |
|---|---|---|---|---|---|
| 5,976,666 | A | * | 11/1999 | Narang | .................. H01Q 17/00 428/137 |
| 2004/0036645 | A1 | * | 2/2004 | Fujieda | .................. H01Q 1/421 342/72 |

(Continued)

FOREIGN PATENT DOCUMENTS

| | | |
|---|---|---|
| JP | 62-89747 A | 4/1987 |
| JP | 5-55780 A | 3/1993 |

(Continued)

OTHER PUBLICATIONS

Extended European Search Report for European Application No. 19815938.6, dated Feb. 17, 2022.
International Search Report, issued in PCT/JP2019/021837, PCT/ISA/210, dated Aug. 20, 2019.

(Continued)

*Primary Examiner* — Bo Fan
(74) *Attorney, Agent, or Firm* — Birch, Stewart, Kolasch & Birch, LLP

(57) ABSTRACT

To provide a transmission-type electromagnetic-wave absorber that can satisfactorily absorb electromagnetic waves of high frequencies in or above the millimeter wave band while reducing the reflection of electromagnetic waves on the surface of the absorber. The transmission-type electromagnetic-wave absorber includes an electromagnetic-wave absorbing layer 1 containing a magnetic iron oxide 1a that magnetically resonates at a frequency in or above the millimeter-wave band and a binder 1b containing an organic material. The real part of the complex relative permittivity of the electromagnetic-wave absorber is 5.5 or less at 1 GHz.

8 Claims, 4 Drawing Sheets

(58) Field of Classification Search
USPC .............. 342/1, 71, 105, 129, 174; 343/872
See application file for complete search history.

(56) References Cited

U.S. PATENT DOCUMENTS

| | | | |
|---|---|---|---|
| 2007/0164893 A1* | 7/2007 | Oka ....................... | H01Q 17/00 |
| | | | 342/1 |
| 2010/0238063 A1* | 9/2010 | Ohkoshi ............ | C01G 49/0045 |
| | | | 252/62.56 |
| 2012/0100004 A1 | 4/2012 | Ohkoshi et al. | |
| 2012/0100064 A1* | 4/2012 | Ohkoshi ................ | C01G 49/06 |
| | | | 423/633 |
| 2017/0349448 A1 | 12/2017 | Ohkoshi et al. | |
| 2018/0366151 A1* | 12/2018 | Ohkoshi ................ | C01G 55/00 |
| 2020/0008328 A1* | 1/2020 | Hiroi ....................... | H01F 1/113 |
| 2020/0267877 A1 | 8/2020 | Hiroi et al. | |

FOREIGN PATENT DOCUMENTS

| | | |
|---|---|---|
| JP | 8-111594 A | 4/1996 |
| JP | 11-354972 A | 12/1999 |
| JP | 2008-60484 A | 3/2008 |
| JP | 2009-59972 A | 3/2009 |
| JP | 2011-233834 A | 11/2011 |
| JP | 2013-213198 A | 10/2013 |
| JP | 2016-135737 A | 7/2016 |
| WO | WO 2017/094752 A1 | 6/2017 |
| WO | WO 2018/084235 A1 | 5/2018 |

OTHER PUBLICATIONS

European Summons to Attend Oral Proceedings Pursuant to Rule 115(1) EPC for corresponding European Application No. 19815938.6, dated Feb. 14, 2024.

Japanese Office Action for Japanese Application No. 2023-095478, dated Jul. 30, 2024, with English translation.

* cited by examiner

ELECTROMAGNETIC WAVE ABSORBER

TECHNICAL FIELD

The present disclosure relates to an electromagnetic-wave absorber having a property of absorbing electromagnetic waves, and in particular to a transmission-type electromagnetic-wave absorber that contains a magnetic iron oxide as an electromagnetic-wave absorbing material to absorb electromagnetic waves of a high frequency in or above a millimeter-wave band.

BACKGROUND ART

Electromagnetic-wave absorbing compositions that absorb electromagnetic waves have been used to avoid the influence of leaked electromagnetic waves emitted to the outside from an electric circuit or the like and the influence of undesirably reflected electromagnetic waves. The electromagnetic-wave absorbing compositions are formed into predetermined shapes depending on the mode of use as electromagnetic-wave absorbing members, including block-shaped electromagnetic-wave absorbers and sheet-shaped electromagnetic-wave absorbing sheets.

Recently, research has advanced on technology utilizing high frequency electromagnetic waves, including centimeter waves having frequencies of several gigahertz (GHz), millimeter waves having frequencies of 30 GHz to 300 GHz, and electromagnetic waves having even higher frequencies of one terahertz (THz) as electromagnetic waves of high frequencies above the millimeter-wave band, in mobile communication such as mobile phones, wireless LANs, and electric toll collection systems (ETC). In response to the technological trend of utilizing such electromagnetic waves of higher frequencies, there is a growing demand for electromagnetic-wave absorbing compositions and electromagnetic-wave absorbers that absorb unnecessary electromagnetic waves to absorb electromagnetic waves in higher frequency bands from the gigahertz band to the terahertz band.

Conventionally, as the electromagnetic-wave absorbers that absorb electromagnetic waves in a high frequency band in or above the millimeter wave band, Patent Document 1 proposes an electromagnetic-wave absorber that has a packed structure of particles having epsilon magnetic iron oxide ($\epsilon$-$Fe_2O_3$) crystal in the magnetic phase. The epsilon magnetic iron oxide exhibits an electromagnetic-wave absorbing capacity in a range from 25 to 100 GHz (see Patent Document 1). Patent Document 2 proposes an oriented body in the form of a sheet that is obtained by kneading fine epsilon magnetic iron oxide particles and a binder and applying a magnetic field to the mixture from the outside during dry curing of the binder to improve the magnetic field orientation of the epsilon magnetic iron oxide particles (see Patent Document 2).

Furthermore, Patent Document 3 proposes an electromagnetic-wave absorbing sheet having elasticity that can absorb centimeter waves, wherein carbon nanotubes are dispersed in silicone rubber (see Patent Document 3).

PRIOR ART DOCUMENTS

Patent Documents

Patent Document 1: JP 2008-060484 A
Patent Document 2: JP 2016-135737 A
Patent Document 3: JP 2011-233834 A

DISCLOSURE OF INVENTION

Problem to be Solved by the Invention

Among the electromagnetic-wave absorbers that absorb electromagnetic waves of a high frequency in or above the millimeter-wave band, an electromagnetic-wave absorber that includes an electromagnetic-wave absorbing layer containing an electromagnetic-wave absorbing material that magnetically resonates with incident electromagnetic waves to absorb the electromagnetic waves may be a transmission-type and function as, e.g., an electromagnetic-wave filter that exclusively absorbs electromagnetic waves of a predetermined frequency. The transmission-type electromagnetic-wave absorber is advantageous in that flexibility and elasticity can be easily imparted to the entire absorber because the absorber does not include an electromagnetic-wave shielding layer that reflects electromagnetic waves unlike a reflection-type electromagnetic-wave absorber, i.e., a $\lambda/4$ type electromagnetic-wave absorber, which absorbs electromagnetic waves by incident waves and reflected waves cancelling each other in a dielectric layer. Moreover, since the shape of the electromagnetic-wave absorber does not affect electromagnetic-wave absorbing properties, the electromagnetic-wave absorber can be formed into a desired shape depending on the intended use, such as a sheet shape or a block shape.

A wide range of applications can be expected for such an electromagnetic-wave absorber that includes an electromagnetic-wave absorbing layer containing an electromagnetic-wave absorbing material that magnetically resonates with incident electromagnetic waves to absorb the electromagnetic waves, by taking advantage of the characteristic that the shape does not affect electromagnetic-wave absorbing properties. However, an electromagnetic-wave absorber that can reduce the reflection of electromagnetic waves on the surface has not yet been studied.

In order to solve the conventional problem, it is an object of the present disclosure to provide a transmission-type electromagnetic-wave absorber that can satisfactorily absorb electromagnetic waves of a high frequency in or above the millimeter-wave band while reducing the reflection of electromagnetic waves on the surface of the absorber.

Means for Solving Problem

In order to solve the above problem, an electromagnetic-wave absorber of the present application is a transmission-type electromagnetic-wave absorber that includes an electromagnetic-wave absorbing layer containing a magnetic iron oxide that magnetically resonates at a frequency in or above a millimeter-wave band and a binder containing an organic material. The real part of the complex relative permittivity of the electromagnetic-wave absorber is 5.5 or less at 1 GHz.

Effects of the Invention

In the electromagnetic-wave absorber of the present application, since the electromagnetic-wave absorbing layer contains a magnetic iron oxide that magnetically resonate at a high frequency in or above the millimeter-wave band as the electromagnetic-wave absorbing material, it can convert electromagnetic waves of a high frequency of several tens of GHz or higher into heat and absorb the electromagnetic waves. Moreover, since the real part of the complex relative permittivity is 5.5 or less at 1 GHz, the reflection on the surface of the electromagnetic-wave absorber is reduced, and electromagnetic waves can be absorbed efficiently in a region where the electromagnetic-wave absorber is disposed.

BRIEF DESCRIPTION OF DRAWINGS

FIG. 2 are graphs showing a relationship between the content of magnetic powder and the relative permittivity in an electromagnetic-wave absorbing layer that contains strontium ferrite and silicone rubber.

DESCRIPTION OF THE INVENTION

Figure 1:
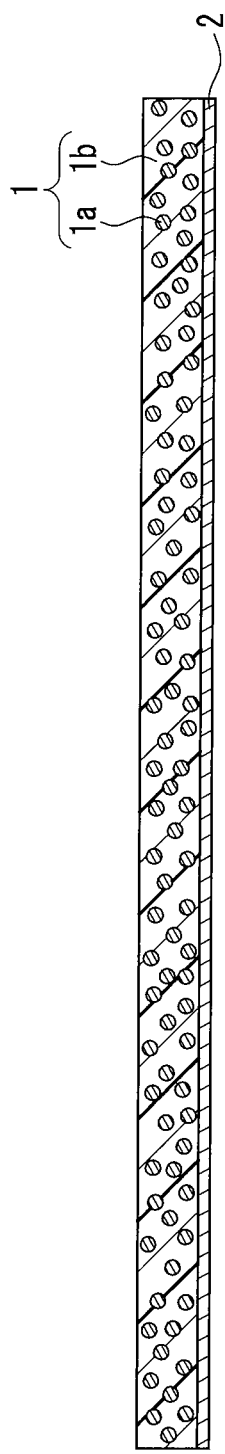
FIG. 1 is a cross-sectional view illustrating the configuration of an electromagnetic-wave absorber of the present embodiment.

The electromagnetic-wave absorber of the present application is a transmission-type electromagnetic-wave absorber that includes an electromagnetic-wave absorbing layer containing a magnetic iron oxide that magnetically resonates at a frequency in or above a millimeter-wave band and a binder containing an organic material. The real part of the complex relative permittivity of the electromagnetic-wave absorber is 5.5 or less at 1 GHz.

With this configuration, the electromagnetic-wave absorber of the present application can absorb electromagnetic waves in a high frequency band of 30 GHz or higher (millimeter-wave band) through magnetic resonance of the magnetic iron oxide, which is contained in the electromagnetic-wave absorbing layer together with the binder containing an organic material. Further, since the real part of the complex relative permittivity of the electromagnetic-wave absorber is 5.5 or less at 1 GHz, the impedance of the electromagnetic-wave absorber approximates to the impedance in the air, so that the reflection of electromagnetic waves on the incident surface of the electromagnetic-wave absorber can be reduced. Thus, it is possible to provide an electromagnetic-wave absorber that can satisfactorily absorb electromagnetic waves passing through a region where the absorber is disposed while being appropriately formed into a desired shape according to a member to be used and an arrangement position.

It is further preferred that the real part of the complex relative permittivity of the electromagnetic-wave absorber is 4.2 or less at 1 GHz.

In the electromagnetic-wave absorber of the present application, it is preferred that the magnetic iron oxide contains hexagonal ferrite or epsilon magnetic iron oxide. By containing hexagonal ferrite or epsilon magnetic iron oxide, which magnetically resonates at a high frequency in or above the millimeter-wave band and has a large coercive force, as the magnetic iron oxide contained in the electromagnetic-wave absorbing layer as the electromagnetic-wave absorbing material, the electromagnetic-wave absorber can have high electromagnetic-wave absorbing properties.

In this case, it is preferred that the hexagonal ferrite is strontium ferrite or barium ferrite, and part of a Fe site of the hexagonal ferrite is substituted with a trivalent metal atom. Further, it is preferred that part of a Fe site of the epsilon magnetic iron oxide is substituted with a trivalent metal atom. By doing so, the frequency of electromagnetic waves to be absorbed by the electromagnetic-wave absorber is appropriately adjusted, and the electromagnetic-wave absorber is imparted with electromagnetic-wave absorbing properties of absorbing electromagnetic waves of a desired frequency.

It is preferred that the binder contains any of thermosetting rubber, thermoplastic elastomer, or thermoplastic resin. By doing so, the flexibility and elasticity of the electromagnetic-wave absorber is appropriately adjusted, and the electromagnetic-wave absorber can have desired physical characteristics.

It is preferred that the electromagnetic-wave absorbing layer is in the form of a sheet. By doing so, an electromagnetic-wave absorber can be entirely formed into a sheet shape and thus handled easily and arranged at a desired position.

The electromagnetic-wave absorber of the present application may have various shapes such as a sheet shape and a block shape. The electromagnetic-wave absorber of the present application may be formed through application of an electromagnetic-wave absorbing material, injection molding, or the like. The production method is not particularly limited, and the electromagnetic-wave absorber of the present application encompasses those formed by various methods.

Hereinafter, the electromagnetic-wave absorber of the present application will be described with reference to the drawings by exemplifying an electromagnetic-wave absorbing sheet entirely in a sheet shape.

Embodiment

[Configuration of Electromagnetic-Wave Absorbing Sheet]

FIG. 1 is a cross-sectional view illustrating the configuration of an electromagnetic-wave absorbing sheet as an electromagnetic-wave absorber of the present embodiment.

FIG. 1 is illustrated for the sake of easy understanding of the configuration of the electromagnetic-wave absorbing sheet to be described in the present embodiment, and does not faithfully reflect the actual sizes, thicknesses, and the like of the members illustrated therein.

The electromagnetic-wave absorbing sheet exemplified in the present embodiment includes an electromagnetic-wave absorbing layer 1 that contains magnetic iron oxide particulate 1a as an electromagnetic-wave absorbing material and a rubber binder 1b, and an adhesive layer 2 disposed on the back surface side (lower side in FIG. 1) of the electromagnetic-wave absorbing layer 1. The adhesive layer 2 provided on the back surface of the electromagnetic-wave absorbing layer 1 as illustrated in FIG. 1 enables the electromagnetic-wave absorbing sheet to be easily adhered to a desired position such as a surface of a housing of an electric device.

In the electromagnetic-wave absorbing sheet of the present embodiment, the magnetic iron oxide 1a contained in the electromagnetic-wave absorbing layer 1 resonates magnetically, and converts electromagnetic waves into heat energy through magnetic loss to absorb the electromagnetic waves. Owing to this, unlike a reflection-type electromagnetic-wave absorbing sheet, it is unnecessary to provide a reflective layer on a surface of the electromagnetic-wave absorbing layer 1 opposite to a surface from which electromagnetic waves are incident, and the sheet can be used as a transmission-type electromagnetic-wave absorbing sheet that absorbs electromagnetic waves passing through the electromagnetic-wave absorbing layer 1. The electromagnetic-wave absorbing sheet of the present embodiment can be also used as an electromagnetic-wave filter that absorbs electromagnetic waves of a predetermined frequency from among electromagnetic waves passing through the electromagnetic-wave absorbing sheet.

The electromagnetic-wave absorbing sheet of the present embodiment is advantageous in that the degree of freedom in shape is high. Specifically, there is no shape restriction, and stable electromagnetic-wave absorbing properties can be obtained regardless of the thickness of the electromagnetic-wave absorbing layer 1 unlike the reflection-type electromagnetic-wave absorbing sheet whose electromagnetic-wave absorption frequency varies with the thickness of the electromagnetic-wave absorbing layer 1. The thickness of the electromagnetic wave absorbing sheet of the present embodiment does not need to be consistent in the main surface direction.

In the electromagnetic-wave absorbing sheet of the present embodiment, various kinds of rubber materials can be used for the binder 1b constituting the electromagnetic-wave absorbing layer 1. Thus, it is possible to obtain an electromagnetic-wave absorbing sheet having elasticity of easily elongating and contracting especially in the in-plane direction. In the electromagnetic-wave absorbing sheet of the present embodiment, since the electromagnetic-wave absorbing layer 1 has a configuration in which the rubber binder 1b contains the magnetic iron oxide 1a, the electromagnetic-wave absorbing sheet is elastic while being highly flexible and can be rolled up in handling and easily arranged on a curved surface.

Moreover, in the electromagnetic-wave absorbing sheet of the present embodiment, since the adhesive layer 2 is disposed on the electromagnetic-wave absorbing layer 1 as described above, the electromagnetic-wave absorbing sheet can be easily adhered to a desired position such as a surface of a member located around a generation source of high frequency electromagnetic waves. Note that the adhesive layer 2 is not an essential element in the electromagnetic-wave absorbing sheet of the present embodiment.

In the electromagnetic-wave absorbing sheet of the present embodiment, the real part of the complex relative permittivity is 5.5 or less at 1 GHz. This causes the impedance of the electromagnetic-wave absorbing sheet to be about 377 Ω, which is the impedance in the air, and approximate to an impedance-matched condition, thereby avoiding a situation that electromagnetic waves entering the electromagnetic-wave absorbing sheet are reflected on the surface of the electromagnetic-wave absorbing sheet. As a result, electromagnetic waves passing through a region where the electromagnetic-wave absorbing sheet is disposed can be absorbed more effectively.

[Electromagnetic-Wave Absorbing Material]

In the electromagnetic-wave absorbing sheet of the present embodiment, hexagonal ferrite or epsilon magnetic iron oxide in the form of fine particles (powder) is used as the magnetic iron oxide 1a contained in the electromagnetic-wave absorbing layer 1 as the electromagnetic-wave absorbing material.

Hexagonal ferrite has a higher magnetic anisotropy and a larger coercive force than other ferrite materials having a different structure such as spinel ferrite, and can be used as an electromagnetic-wave absorbing material having high electromagnetic-wave absorbing properties.

Preferred examples of the hexagonal ferrite include barium ferrite magnetic powder and strontium ferrite magnetic powder. Similarly to the above epsilon magnetic iron oxide, part of a Fe site of the hexagonal ferrite may be substituted with a trivalent metal atom to change the magnetic resonance frequency, whereby the frequency of electromagnetic waves to be absorbed by the electromagnetic-wave absorbing material can be adjusted.

The epsilon phase of epsilon magnetic iron oxide ($\varepsilon$-$Fe_2O_3$) is a phase that appears between the alpha phase ($\alpha$-$Fe_2O_3$) and the gamma phase ($\gamma$-$Fe_2O_3$) in ferric oxide ($Fe_2O_3$). Epsilon magnetic iron oxide is a magnetic material that can be obtained in a single-phase state through a nanoparticle synthesis method that combines a reverse micelle method and a sol-gel method.

Epsilon magnetic iron oxide is a fine particle of several nm to several tens of nm but has a coercive force of about 20 kOe at room temperature, which is the largest coercive force among metal oxides. Further, since the natural magnetic resonance by a gyromagnetic effect based on the precession occurs in a frequency band of several tens of GHz or higher (millimeter-wave band), epsilon magnetic iron oxide absorbs electromagnetic waves having frequencies of 30 to 300 GHz (millimeter-wave band) or even higher In epsilon magnetic iron oxide, by substituting part of the Fe site of the crystal with a trivalent metal element such as aluminum (Al), gallium (Ga), rhodium (Rh) or indium (In), it is possible to change the magnetic resonance frequency, i.e., the frequency of electromagnetic waves to be absorbed when epsilon magnetic iron oxide is used as the electromagnetic-wave absorbing material.

For example, epsilon magnetic iron oxide substituted with gallium ($\varepsilon$-$Ga_xFe_{2-x}O_3$) has an absorption peak in a frequency band from about 30 GHz to 150 GHz as a result of adjusting the substitution amount "x". Epsilon magnetic iron oxide substituted with aluminum ($\varepsilon$-$Al_xFe_{2-x}O_3$) has an absorption peak in a frequency band from about 100 GHz to 190 GHz as a result of adjusting the substitution amount "x". Further, in the case of using epsilon magnetic iron oxide substituted with rhodium ($\varepsilon$-$Rh_xFe_{2-x}O_3$), it is possible to shift the frequency band of electromagnetic waves to be absorbed in an even higher direction of 180 GHz or higher. Thus, the frequency of electromagnetic waves to be absorbed can be set to a desired value by selecting the type of the element with which the Fe site of the epsilon magnetic iron oxide is substituted and adjusting the substitution amount of Fe so that the natural resonance frequency of the epsilon magnetic iron oxide will be a desired frequency to be absorbed by the electromagnetic-wave absorbing sheet.

The hexagonal ferrite and epsilon magnetic iron oxide to be used as the magnetic iron oxide, including those in which part of the Fe site is substituted with metal, can be obtained easily on the market.

[Binder]

Various kinds of rubber materials can be used for the rubber binder 1b constituting the electromagnetic-wave absorbing layer 1 of the electromagnetic-wave absorbing sheet of the present embodiment. Examples of the rubber materials include natural rubber (NR), isoprene rubber (IR), butadiene rubber (BR), butyl rubber (IIR), nitrile rubber (NBR), ethylene-propylene rubber (EPDM), chloroprene rubber (CR), acrylic rubber (ACM), chlorosulfonated polyethylene rubber (CSR), urethane rubber (PUR), silicone rubber (Q), fluororubber (FKM), ethylene-vinyl acetate rubber (EVA), epichlorohydrin rubber (CO), polysulfide rubber (T), and urethane rubber (U).

Further, according to the definition that rubber is a material having rubber elasticity at room temperature, the following thermoplastic elastomers can also be used as the rubber binder 1b of the electromagnetic-wave absorbing sheet of the present embodiment because they have fluidity at high temperature and rubber elasticity at room temperature: a styrene-based thermoplastic elastomer (a styrene-isoprene copolymer (SIS), a styrene-butadiene copolymer (SBS)), an olefin-based thermoplastic elastomer, a urethane-based thermoplastic elastomer, and a polyester-based thermoplastic elastomer. These materials are also included as the rubber materials broadly.

Among these rubber materials, acrylic rubber and silicone rubber are suitably used because of their high heat resistance. Acrylic rubber offers excellent oil resistance even in high temperature environments while being relatively inexpensive and cost-effective. Silicone rubber offers both high heat resistance and high cold resistance. As a physical property, silicone rubber is the most temperature-independent rubber among synthetic rubbers, and offers also excellent solvent resistance, ozone resistance, and weather resistance. Further, silicone rubber has excellent electrical insulation properties while being physically stable in a wide temperature range and a wide frequency region.

In the present embodiment, the rubber binders are exemplified as the binder of the electromagnetic-wave absorbing layer 1, but resin materials such as thermoplastic resin can also be used as the binder.

Examples of the resin binder for the electromagnetic-wave absorbing layer include epoxy resin, polyester resin, polyurethane resin, acrylic resin, phenol resin, and melamine resin. More specifically, the epoxy resin may be, e.g., a compound obtained by epoxidation of hydroxyl groups at both ends of bisphenol A. The polyurethane resin may be, e.g., polyester urethane resin, polyether urethane resin, polycarbonate urethane resin, or epoxy urethane resin. The acrylic resin may be, e.g., a functional group-containing methacrylic polymer obtained by copolymerization of: alkyl acrylate and/or alkyl methacrylate, both of which are methacrylic resin having an alkyl group with 2 to 18 carbon atoms; a functional-group containing monomer; and optionally other modifying monomers copolymerizable therewith.

An electromagnetic-wave absorbing sheet containing such a thermoplastic resin as the binder is not as elastic as an electromagnetic-wave absorbing sheet containing any of the above rubber binders, but has a certain degree of flexibility. An electromagnetic-wave absorbing sheet having flexibility refers to, e.g., an electromagnetic-wave absorbing sheet that does not crease or tear even when the sheet is bend entirely with its both ends being overlapped, wrapped around a metal rod, or the like, and that can return to its original flat shape in response to being released from an external force.

Further, in the case of using a heat-resistant, high-melting point thermoplastic resin as a thermoplastic resin for forming a molded body, the following can be used: aromatic polyamides such as 6T nylon (6TPA), 9T nylon (9TPA), 10T nylon (10TPA), 12T nylon (12TPA), MXD6 nylon (MXDPA), and their alloy materials, polyphenylene sulfide (PPS), liquid crystal polymer (LCP), polyether ether ketone (PEEK), polyetherimide (PEI), and polyphenylsulfone (PPSU).

The binder in the invention of the present application functions as a binding agent for molding a magnetic compound into a predetermined shape such as a sheet shape or a molded body using a mold. The magnetic compound is prepared by dispersing a magnetic iron oxide as the electromagnetic-wave absorbing material in a binder.

[Dispersant]

It is more preferable to use a dispersant to favorably disperse a magnetic iron oxide as the electromagnetic-wave absorbing material in a rubber binder.

Examples of the dispersant include compounds having a polar group such as a phosphate group, a sulfonate group, or a carboxy group. Among them, the dispersant is preferably a phosphate compound having a phosphate group in the molecule.

Examples of the phosphate compound include: allyl sulfonic acids such as phenylphosphonic acid and phenylphosphonic dichloride; alkylphosphonic acids such as methylphosphonic acid, ethylphosphonic acid, octylphosphonic acid, and propylphosphonic acid; and polyfunctional phosphonic acids such as hydroxyethanediphosphonic acid and nitrotris methylene phosphonic acid. These phosphate compounds are flame retardant and function as a dispersant for fine magnetic iron oxide powder, so that epsilon magnetic iron oxide particles can be dispersed favorably in the binder.

Specifically, the dispersant may be phenylphosphonic acid (PPA) manufactured by Wako Pure Chemical Corporation or Nissan Chemical Corporation, or an oxidized phosphate ester "JP-502" (trade name) manufactured by JOHOKU CHEMICAL CO., LTD.

Examples of the dispersant to be contained in the electromagnetic-wave absorbing sheet of the present embodiment other than the phosphate compounds include: fatty acids with 12 to 18 carbon atoms (RCOOH, where R is an alkyl group or an alkenyl group with 11 to 17 carbon atoms) such as caprylic acid, capric acid, lauric acid, myristic acid, palmitic acid, stearic acid, behenic acid, oleic acid, elaidic acid, linoleic acid, linolenic acid and stearolic acid, metal soaps composed of alkali metals or alkali earth metals of the above fatty acids, compounds containing fluorine of the above fatty acid esters, and amides of the above fatty acids; polyalkylene oxide alkylphosphate ester, lecithin, trialkyl polyolefin oxy-quaternary ammonium salt (where alkyl has 1 to 5 carbon atoms, and olefin is ethylene, propylene, or the like), and copper phthalocyanines. Further, the dispersant may be a silane or a silane coupling agent. These dispersants may be used singly or in a combination.

[Production Method of Electromagnetic-Wave Absorbing Sheet]

The following describes the production method of the electromagnetic-wave absorbing layer 1 of the electromagnetic-wave absorbing sheet of the present embodiment.

The electromagnetic-wave absorbing layer 1 of the electromagnetic-wave absorbing sheet of the present embodiment can be formed by preparing a magnetic compound containing magnetic iron oxide powder 1a and a rubber binder 1b, and molding and cross-linking the magnetic compound into a predetermined thickness.

First, the magnetic compound is prepared.

The magnetic compound can be obtained by kneading hexagonal ferrite powder or epsilon iron oxide powder, a dispersant, and a rubber binder. In one example, a pressurized batch-type kneader can be used to obtain a kneaded mixture. At this time, a crosslinking agent may be added as needed.

In one example, the obtained magnetic compound is cross-linked and formed into a sheet at a temperature of 165° C. using a hydraulic press machine.

Then, the sheet is subjected to secondary crosslinking at a temperature of 170° C. in a thermostat to form an electromagnetic-wave absorbing layer 1.

The production method of the electromagnetic-wave absorbing sheet of the present application other than application of the magnetic coating material is, e.g., extrusion molding.

Specifically, hexagonal ferrite powder or epsilon iron oxide powder, a dispersant, and a binder are blended in advance as needed, and the blended material is supplied into a plasticizing cylinder from a resin supply port of an extrusion molding machine. The extrusion molding machine may be an ordinary extrusion molding machine that includes a plasticizing cylinder, a die disposed at the tip of the plasticizing cylinder, a screw rotatably disposed in the plasticizing cylinder, and a drive that drives the screw. The molten material plasticized by a band heater of the extrusion molding machine is fed forward by rotation of the screw and extruded into a sheet shape from the tip. The extruded material is subjected to processing such as drying, pressure molding, and calendering to obtain an electromagnetic-wave absorbing layer having a predetermined shape.

A molded body can be formed by blending hexagonal ferrite powder or epsilon iron oxide powder, a dispersant, and a binder in advance as needed, supplying the blended material into a plasticizing cylinder from a resin supply port of an injection molding machine and melt-kneading it in the plasticizing cylinder with the screw, and injecting the molten resin into a mold that is connected to the tip of the injection molding machine.

The electromagnetic-wave absorber can be formed into a molded body having a desired shape using a mold. For example, the electromagnetic-wave absorber may be formed into an antenna horn having a hollow pyramid trapezoid shape or a hollow cone trapezoid shape, or may be formed into a housing (e.g., box shape, cylindrical shape) of an electric device in which various electronic circuit components are to be disposed. Thus, the electromagnetic-wave absorber can be formed into a structure with an electromagnetic-wave absorbing ability. This eliminates a process of adhering a sheet-shaped electromagnetic-wave absorber to the surface of a housing made from a different member such as resin.

[Adhesive Layer]

In the electromagnetic-wave absorbing sheet of the present embodiment, the adhesive layer 2 is formed on the back surface of the electromagnetic-wave absorbing layer 1 as illustrated in FIG. 1.

By providing the adhesive layer 2, the electromagnetic-wave absorbing layer 1 can be adhered to a desired position such as an inner surface of a housing that accommodates an electric circuit, or an inner surface or outer surface of an electric device. Specifically, since the electromagnetic-wave absorbing layer 1 of the electromagnetic-wave absorbing sheet of the present embodiment has flexibility, it can be easily adhered to a curved surface (bent surface) via the adhesive layer 2, which improves the handleability of the electromagnetic-wave absorbing sheet.

The adhesive layer 2 may be formed from a known material used as an adhesive layer such as an adhesive tape, an acrylic adhesive, a rubber adhesive, a silicone adhesive, etc. A tackifier or a crosslinking agent may be used to adjust the tackiness to an adherend and reduce adhesive residue. The tackiness to the adherend is preferably 5 N/10 mm to 12 N/10 mm. If the tackiness is smaller than 5 N/10 mm, the electromagnetic-wave absorbing sheet will easily peel off of the adherend or shift in some cases. If the tackiness is greater than 12 N/10 mm, the electromagnetic-wave absorbing sheet will be more difficult to peel off of the adherend.

The thickness of the adhesive layer 2 is preferably 20 µm to 100 µm. If the thickness of the adhesive layer is less than 20 µm, the tackiness will decrease, and the electromagnetic-wave absorbing sheet will easily peel off of the adherend or shift in some cases. If the thickness of the adhesive layer is greater than 100 µm, the flexibility of the electromagnetic-wave absorbing sheet as a whole may decrease. If the adhesive layer 2 is thick, the electromagnetic-wave absorbing sheet will be unlikely to peel off of the adherend. If the cohesive power of the adhesive layer 2 is small, adhesive residue will appear on the adherend in some cases when the electromagnetic-wave absorbing sheet is peeled off.

In the present specification, the adhesive layer 2 may be either peelable or unpeelable.

An electromagnetic-wave absorbing sheet not provided with an adhesive layer 2 can be also adhered to a predetermined surface by imparting tackiness to a surface of a member on which the electromagnetic-wave absorbing sheet is to be disposed through application of an adhesive, or by using a double-sided tape or an adhesive. In this regard, the adhesive layer 2 is clearly not an essential component in the electromagnetic-wave absorbing sheet of the present embodiment.

[Relative Permittivity]

In the electromagnetic-wave absorbing sheet of the present embodiment, the real part of the complex relative permittivity is 5.5 or less at 1 GHz. This causes the input impedance of the electromagnetic-wave absorbing sheet to approximate to the impedance in the air (vacuum) of 377 Ω. Owing to this, it is possible to reduce the reflection of electromagnetic waves propagating in the air upon entering the electromagnetic-wave absorbing sheet, which is caused by the difference in impedance between air and the electromagnetic-wave absorbing sheet. Thus, more electromagnetic waves can enter the electromagnetic-wave absorbing sheet and be absorbed by the magnetic iron oxide powder as the electromagnetic-wave absorbing material.

As to the magnetic iron oxide contained in the electromagnetic-wave absorbing layer, the real part of the complex relative permittivity of both of hexagonal ferrite and epsilon magnetic iron oxide is about 20 or more. To make the complex relative permittivity of the electromagnetic-wave absorbing layer be 5.5 or less, materials having a small complex relative permittivity are selected for a polymeric binder contained in the electromagnetic-wave absorbing layer and a filler or the like added to the electromagnetic-wave absorbing layer, and the content (volume content) of the magnetic iron oxide powder in the electromagnetic-wave absorbing layer is appropriately adjusted. The electromagnetic-wave absorbing sheet of the present embodiment includes an adhesive layer on the back surface of the electromagnetic-wave absorbing layer as illustrated in FIG. 1. By reducing the thickness of the adhesive layer, an influence of the adhesive layer on the relative permittivity of the electromagnetic-wave absorbing sheet as a whole will be almost negligible.

The following describes the measurement results of the complex relative permittivity and the electromagnetic-wave absorbing properties of actually formed electromagnetic-wave absorbing layers.

Figure 2A:
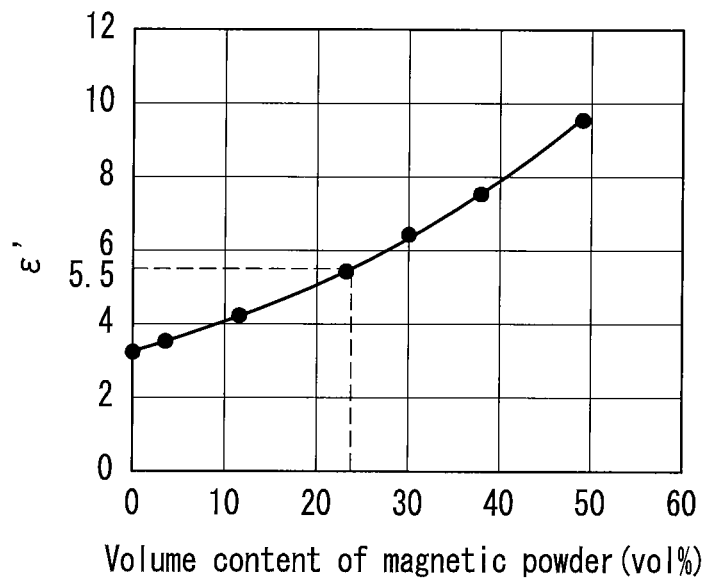
FIG. 2A shows a relationship between the volume content of magnetic powder and the real part of the complex relative permittivity.
Figure 2B:
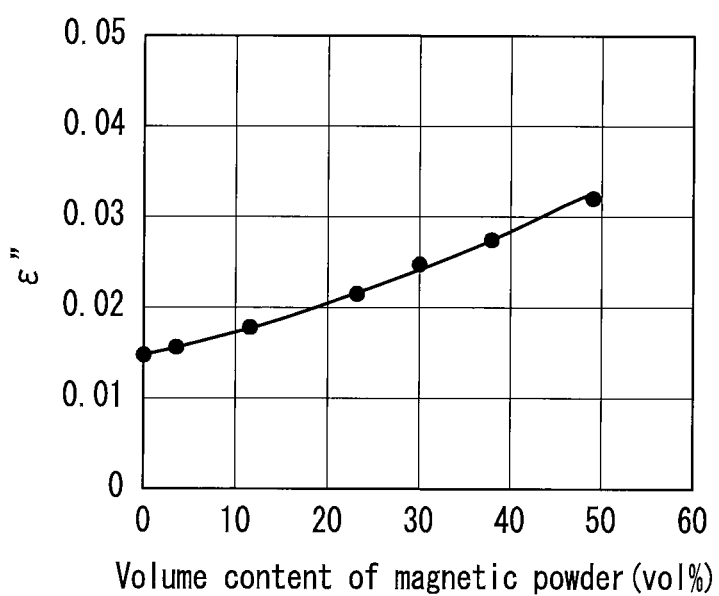
FIG. 2B shows a relationship between the volume content of magnetic powder and the imaginary part of the complex relative permittivity.

FIGS. 2A and 2B are graphs showing changes in the complex relative permittivity according to the volume content of the magnetic powder.

Aluminum-substituted strontium ferrite magnetic powder ($SrFe_{10.56}Al_{1.44}O_{19}$) was used as the electromagnetic-wave absorbing material, and silicone rubber KE-541-U (trade name) manufactured by Shin-Etsu Chemical Co., Ltd., was used as the rubber binder. FIG. 2A shows changes in a real part $\varepsilon'$ of the complex relative permittivity, and FIG. 2B shows changes in an imaginary part $\varepsilon''$ of the complex relative permittivity.

Electromagnetic-wave absorbing layers with different volume contents of magnetic powder were produced, and the complex relative permittivities of the electromagnetic-wave absorbing layers were measured according to the capacity method using an impedance analyzer 4291B (trade name) manufactured by Agilent Technologies Japan, Ltd. More specifically, magnetic compounds with different volume contents of strontium ferrite magnetic powder were prepared, and each magnetic compound was molded and cross-linked into a square shape having a thickness of 2 mm and a diagonal of 120 mm to prepare a measurement sample. Each sample was sandwiched between measurement electrodes and measured at a measurement frequency of 1 GHz using a test fixture 16453A (trade name: manufactured by Agilent Technologies Japan, Ltd.).

As shown in FIG. 2A, the real part ($\varepsilon'$) of the complex relative permittivity of the electromagnetic-wave absorbing layer containing the aluminum-substituted strontium ferrite magnetic powder was increased in keeping with the volume content of the magnetic powder, from 3.25 at the volume content of the magnetic powder of 0% to about 9.5 at the volume content of 50%. As shown in FIG. 2B, the imaginary part ($\varepsilon''$) of the complex relative permittivity was increased in keeping with the volume content of the magnetic powder, from 0.03 at the volume content of the magnetic powder of 0% to about 0.032 at the volume content of 50%.

Although the complex relative permittivity of the magnetic powder in the form of powder cannot be measured, it is considered to be 20 or more. The real part ($\varepsilon'$) of the complex relative permittivity represents the amount of energy accumulated to the dielectric from the external electric field, and the imaginary part ($\varepsilon''$) of the complex relative permittivity represents the energy loss of the dielectric with respect to the external electric field. Therefore, only the real part of the complex relative permittivity needs to be taken into account in judging the impedance of the dielectric.

On this basis, the reflection and the absorption of electromagnetic waves in the electromagnetic-wave absorbing layer were measured according to the free-space method by actually irradiating each sample with electromagnetic waves.

Figure 3:
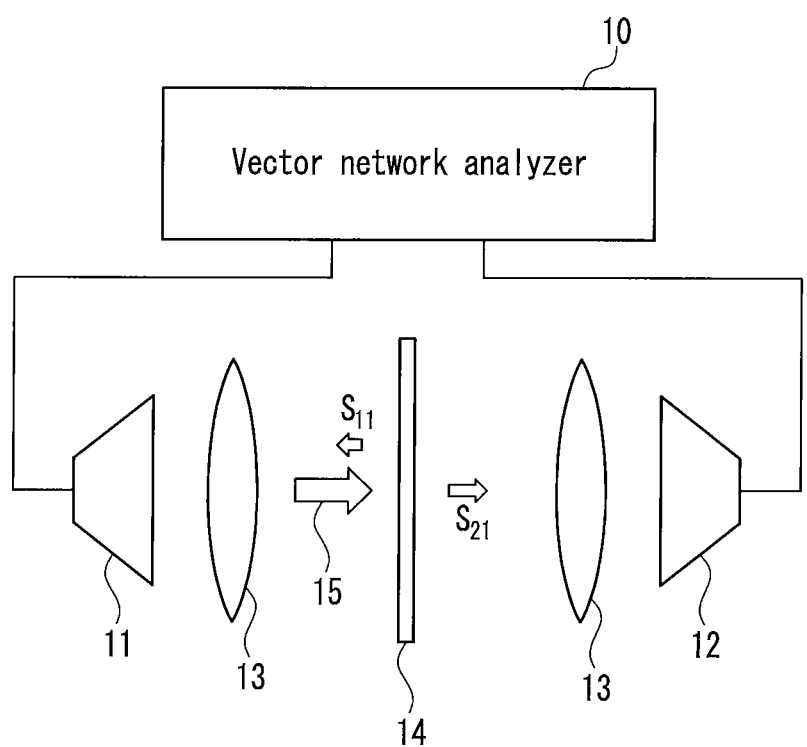
FIG. 3 is a model diagram illustrating a free-space method for measuring the reflection of electromagnetic waves on the surface of an electromagnetic-wave absorber.

FIG. 3 is an image diagram illustrating the state of the measurement according to the free-space method.

As shown in FIG. 3, in a millimeter-wave vector network analyzer MS4647B (trade name: manufactured by ANRITSU CORPORATION) 10, a transmission antenna 11 was connected to a port (port 1) of the analyzer 10, and a reception antenna 12 was connected to another port (port 2) of the analyzer 10. A measurement sample 14 formed into 100 mmφ was irradiated with electromagnetic waves 15 having a frequency of 60 GHz via a dielectric lens 13 to measure reflected waves Su reflected at the sample 14 and transmitted waves $S_{21}$ transmitted through the sample 14.

A reflection attenuation amount was calculated from the magnitude of the reflected waves $S_{11}$ with respect to the intensity of electromagnetic waves as incident waves of 0.1 mW (the reflection attenuation amount is 0 dB when incident waves are all reflected). A reflectance (%) represents a ratio of the reflected waves $S_{11}$ to the incident waves 15 (Reflectance=Reflected waves $S_{11}$/Incident waves). An electromagnetic-wave attenuation amount, which is the degree of absorption of electromagnetic waves in the sample 14 (electromagnetic-wave absorbing layer), was calculated from the magnitude of the transmitted waves $S_{21}$ (the electromagnetic-wave attenuation amount is 0 dB when incident waves are all transmitted through the sample 14).

Table 1 shows the measurement results.

TABLE 1

| Reflectance (%) | $S_{11}$ (dB) | Volume content (vol %) | Relative permittivity (real part) | Relative permittivity (imaginary part) | Dielectric loss tangent |
|---|---|---|---|---|---|
| >25% | ≤−6.99 | >37.7% | | | |
| 20% | −6.99 | 37.7% | 7.53 | 0.027 | 0.004 |
| 15% | −8.24 | 23.0% | 5.43 | 0.022 | 0.004 |
| 10% | −10.00 | 11.5% | 4.20 | 0.018 | 0.004 |
| 5% | −13.01 | 3.5% | 3.52 | 0.016 | 0.004 |

As shown in Table 1, when the volume content of the strontium ferrite magnetic powder in the electromagnetic-wave absorbing layer was larger than 37.7%, the reflectance on the surface of the electromagnetic-wave absorbing layer was larger than 25%. Meanwhile, when the volume content of the strontium ferrite magnetic powder was 23% or less and thus the real part of the complex relative permittivity of the electromagnetic-wave absorbing layer was 5.43 or less, the reflectance on the surface of the electromagnetic-wave absorbing layer was reduced to 15% or less.

In the transmission-type electromagnetic-wave absorbing sheet that contains hexagonal ferrite or epsilon magnetic iron oxide as the electromagnetic-wave absorbing material, the electromagnetic-wave attenuation amount of incident electromagnetic waves increases as the volume content of the magnetic powder in the electromagnetic-wave absorbing layer raises. However, as shown in the measurement results, when the volume content of the magnetic powder in the electromagnetic wave absorbing sheet exceeds 37%, the real part of the complex relative permittivity exceeds 7, and 25% or more of incident waves are reflected on the surface of the electromagnetic-wave absorbing sheet. Under the use condition that the reflection of electromagnetic waves on the surface of the electromagnetic-wave absorbing sheet causes a problem, adequate electromagnetic-wave absorbing properties cannot be exhibited in some cases only by increasing the volume content of the magnetic iron oxide in the electromagnetic-wave absorbing layer.

On the other hand, in the electromagnetic-wave absorbing sheet of the present embodiment, by setting the real part of the complex relative permittivity of the electromagnetic-wave absorbing sheet to 5.5 or less, the reflection on the surface of the electromagnetic-wave absorbing sheet can be reduced to 15% or less. Thus, the electromagnetic-wave absorbing sheet can be suitably used for applications in which the reflection of electromagnetic waves on the surface of the electromagnetic-wave absorbing sheet is undesired, including a case of arranging the electromagnetic-wave absorbing sheet in the vicinity of an electromagnetic-wave generation source or an antenna element. Further, as can be understood from Table 1, by setting the real part of the complex relative permittivity of the electromagnetic-wave absorbing sheet to 4.2 or less, the reflection on the surface of the electromagnetic-wave absorbing sheet can be reduced to 10% or less. Thus, the electromagnetic-wave absorbing sheet can be more suitably used for applications in which the reflection on the surface of the electromagnetic-wave absorbing sheet is undesired.

The present inventors found that the electromagnetic-wave attenuation amount as the electromagnetic-wave absorbing ability increases approximately proportional to the thickness of the electromagnetic-wave absorbing layer when the volume content of the magnetic iron oxide in the electromagnetic-wave absorbing layer is the same. Therefore, when the electromagnetic-wave absorbing sheet is used under the condition that the reflection of electromagnetic waves on the surface of the sheet causes a problem, it is preferable to adjust not only the volume content of the magnetic iron oxide but also the thickness of the electromagnetic-wave absorbing layer to impart more suitable electromagnetic-wave absorbing properties to the sheet.

Figure 4:
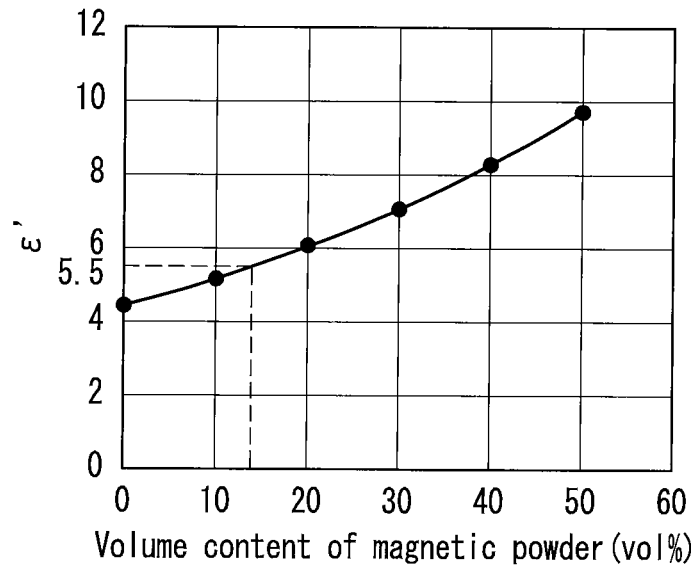
FIG. 4 is a graph showing a relationship between the volume content of magnetic powder and the relative permittivity (real part) in an electromagnetic-wave absorbing layer that contains strontium ferrite and acrylic rubber.
Figure 5:
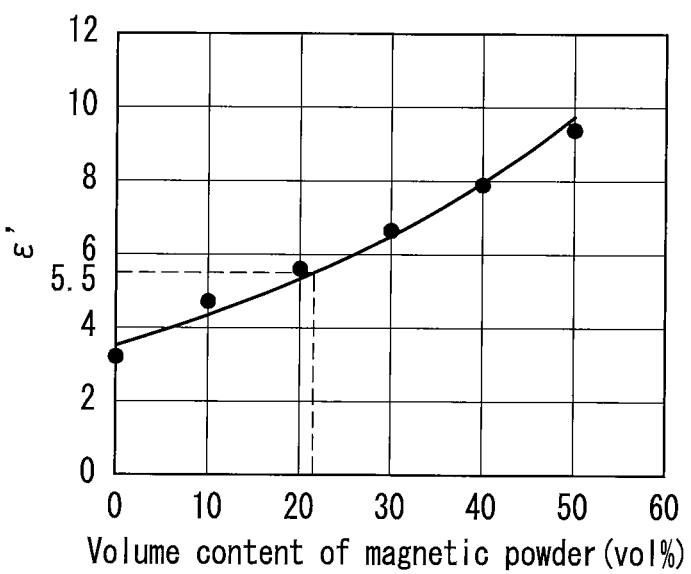
FIG. 5 is a graph showing a relationship between the volume content of magnetic powder and the relative permittivity (real part) in an electromagnetic-wave absorbing layer that contains epsilon magnetic iron oxide and silicone rubber.

FIG. 4 is a graph showing changes in the complex relative permittivity (real part) according to the volume content of the magnetic powder of the electromagnetic-wave absorbing sheet. Aluminum-substituted strontium ferrite ($SrFe_{10.56}Al_{1.44}O_{19}$) was used as the magnetic powder, and acrylic rubber AR-51 (trade name) (complex relative permittivity: 4.44) manufactured by ZEON CORPORATION was used as the binder. FIG. 5 is a graph showing changes in the complex relative permittivity (real part) according to the volume content of the magnetic powder of the electromagnetic-wave absorbing sheet. Gallium-substituted epsilon magnetic iron oxide ($\varepsilon$-$Ga_{0.47}Fe_{1.52}O_3$) was used as the magnetic powder, and silicone rubber KE-541-U (trade name) (complex relative permittivity: 3.25) manufactured by Shin-Etsu Chemical Co., Ltd., was used as the binder.

In FIGS. 4 and 5, similarly to FIG. 2, electromagnetic-wave absorbing layers with different volume contents of magnetic powder were produced, and the complex relative permittivities of the electromagnetic-wave absorbing layers were measured according to the capacity method using an impedance analyzer 4291B (trade name) manufactured by Agilent Technologies Japan, Ltd. The size of the samples and the measurement jig used in the measurement in FIGS. 4 and 5 were the same as those used in the measurement of the electromagnetic-wave absorbing sheets that contain strontium ferrite and silicone rubber in FIG. 2.

As to the electromagnetic-wave absorbing sheets that contain acrylic rubber as the binder in FIG. 4, the real part of the complex relative permittivity at the volume content of the magnetic powder of 0% was 4.44, which is higher than that in the case of using silicone rubber as the binder. To make the complex relative permittivity of the electromagnetic-wave absorbing layer be 5.5 or less, it is necessary to set the volume content of the magnetic powder to 14% or less.

As to the electromagnetic-wave absorbing sheets that contain epsilon magnetic iron oxide as the magnetic powder in FIG. 5, the rise in the complex relative permittivity according to the increase in the content of the magnetic powder was slightly larger than the case of using strontium ferrite as the magnetic powder in FIG. 3, and the volume content of the magnetic iron oxide powder to make the complex relative permittivity be 5.5 or less was 22% or less.

The impedances of the electromagnetic-wave absorbing sheets will be almost the same as long as the real part of the complex relative permittivity of the electromagnetic-wave absorbing sheets is equal, even if different magnetic powders and binders are used. By setting the real part of the complex relative permittivity to 5.5 or less, the surface reflection characteristics with respect to incident electromagnetic waves can be lowered similarly to the above-described electromagnetic-wave absorbing layers that contain strontium ferrite and silicone rubber.

As described above, the reflection of electromagnetic waves on the surface of the electromagnetic-wave absorbing sheet can be reduced by including the electromagnetic-wave absorbing layer that contains a magnetic iron oxide that magnetically resonates at a frequency in or above the millimeter-wave band and a binder containing an organic material, and setting the real part of the complex relative permittivity to 5.5 or less at 1 GHz.

Although the above embodiment exemplifies the electromagnetic-wave absorbing sheet having a rectangular shape in the plane view, the shape of the electromagnetic-wave absorbing sheet is not limited; besides, it is unnecessary to make the thickness of the electromagnetic-wave absorbing sheet constant because electromagnetic waves are absorbed by the magnetic resonance of the magnetic powder contained as the electromagnetic-wave absorbing member.

The shape of the electromagnetic-wave absorber of the present application is not limited to the sheet shape described in the embodiment, and the electromagnetic-wave absorber may have a block shape with a certain thickness. Further, since the shape or the thickness of the electromagnetic-wave absorber does not affect the electromagnetic-wave absorbing properties, the electromagnetic-wave absorber can be formed into various shapes such as a hollow tubular shape, a cone shape, and a bowl shape. Thus, the electromagnetic-wave absorber can be easily formed into various shapes to correspond to an arrangement position, and further to satisfy another functional requirement for a case of, for example, serving also as a reflector that reflects electromagnetic waves of frequencies other than the frequency to be absorbed by the electromagnetic-wave absorber. Moreover, the electromagnetic-wave absorber can be favorably used for a situation that the reflection of electromagnetic waves on the surface of the electromagnetic-wave absorbing sheet worsens the electromagnetic-wave interference with a device.

The hardness of the electromagnetic-wave absorber in the form of a sheet or a block having a predetermined thickness is preferably 80 or less according to durometer hardness (type A). The electromagnetic-wave absorbing sheet and the electromagnetic-wave absorber having a durometer hardness (type A) of 80 or less can be easily processed and have a certain level of softness (elasticity) and thus are hard to break (e.g., chipping) by a shock.

When the electromagnetic-wave absorber takes the shape other than the sheet shape described in the above embodiment, e.g., a block shape, various methods based on the shape can be adopted to adjust the real part of the relative permittivity at 1 GHz. For example, when the electromagnetic-wave absorber is formed as a foam, the relative permittivity can be reduced. In this case, the electromagnetic-wave absorber may be constituted entirely by a foam, partially by a foam in the thickness direction, or may have different porosity in the thickness direction. Further, the relative permittivity of the electromagnetic-wave absorber can be decreased by reducing a plane view area of the electromagnetic-wave absorber on the electromagnetic-wave incident side, i.e., by forming the electromagnetic-wave absorber into a shape narrower in the electromagnetic-wave incident direction. In this manner, the real part of the complex relative permittivity of the electromagnetic-wave absorber can be 5.5 or less by adjusting the shape of the electromagnetic-wave absorber as well as the volume content of the magnetic powder (electromagnetic-wave absorbing member) and the thickness of the electromagnetic-wave absorber as described in the above embodiment. Thus, the relative permittivity of the electromagnetic-wave absorber having a predetermined thickness does not need to be uniform in the thickness direction.

In the electromagnetic-wave absorber of the present application, the reason that the real part of the complex relative permittivity is set at electromagnetic waves of 1 GHz is that 1 GHz is the highest frequency among frequencies that can be relatively easily measured and shows a tendency, in terms of relative permittivity, similar to electromagnetic waves in a frequency band in or above the millimeter-wave band, which is a target frequency band to be absorbed by the electromagnetic-wave absorber of the present application.

INDUSTRIAL APPLICABILITY

The electromagnetic-wave absorber of the present application is useful as an electromagnetic-wave absorber that absorbs electromagnetic waves in a high frequency band in or above the millimeter-wave band while reducing the reflection of electromagnetic waves of a frequency to be absorbed on the surface of the absorber.

DESCRIPTION OF REFERENCE NUMERALS

1 Electromagnetic-wave absorbing layer
1a Magnetic iron oxide powder (electromagnetic-wave absorbing material)
1b Binder

The invention claimed is:

1. A transmission-type electromagnetic-wave absorber, comprising:
   an electromagnetic-wave absorbing layer comprising a magnetic iron oxide that magnetically resonates at a frequency in or above a millimeter-wave band and a binder comprising an organic material,
   wherein a value of a real part of a complex relative permittivity of the electromagnetic-wave absorber is more than a numerical value of a real part of a complex relative permittivity of the electromagnetic-wave absorber at a volume content of the magnetic iron oxide of 0% and is 5.5 or less at 1 GHz.

2. The electromagnetic-wave absorber according to claim 1, wherein the real part of the complex relative permittivity of the electromagnetic-wave absorber is 4.2 or less at 1 GHz.

3. The electromagnetic-wave absorber according to claim 1, wherein the magnetic iron oxide comprises hexagonal ferrite or epsilon magnetic iron oxide.

4. The electromagnetic-wave absorber according to claim 3, wherein the hexagonal ferrite is strontium ferrite or barium ferrite, and part of a Fe site of the hexagonal ferrite is substituted with a trivalent metal atom.

5. The electromagnetic-wave absorber according to claim 3, wherein part of a Fe site of the epsilon magnetic iron oxide is substituted with a trivalent metal atom.

6. The electromagnetic-wave absorber according to claim 1, wherein the binder comprises any of thermosetting rubber, thermoplastic elastomer, or thermoplastic resin.

7. The electromagnetic-wave absorber according to claim 1, wherein the electromagnetic-wave absorbing layer is in the form of a sheet.

8. The electromagnetic-wave absorber according to claim 1, wherein the volume content of the magnetic iron oxide contained in the electromagnetic-wave absorbing layer is 3.5% or more.

* * * * *